US009073085B2

(12) United States Patent
Kandori et al.

(10) Patent No.: US 9,073,085 B2
(45) Date of Patent: Jul. 7, 2015

(54) ELECTROMECHANICAL TRANSDUCER

(71) Applicant: CANON KABUSHIKI KAISHA, Tokyo (JP)

(72) Inventors: Atsushi Kandori, Ebina (JP); Takahiro Akiyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/344,587

(22) PCT Filed: Oct. 25, 2012

(86) PCT No.: PCT/JP2012/078265
§ 371 (c)(1),
(2) Date: Mar. 12, 2014

(87) PCT Pub. No.: WO2013/073374
PCT Pub. Date: May 23, 2013

(65) Prior Publication Data
US 2015/0009778 A1    Jan. 8, 2015

(30) Foreign Application Priority Data

Nov. 14, 2011  (JP) .................................. 2011-248680

(51) Int. Cl.
*B06B 1/02* (2006.01)
*B81B 3/00* (2006.01)
(Continued)

(52) U.S. Cl.
CPC .............. *B06B 1/0292* (2013.01); *G01H 11/06* (2013.01); *B81B 3/0086* (2013.01); *G01S 7/52017* (2013.01)

(58) Field of Classification Search
CPC .... B06B 1/0292; G01H 11/06; B81B 3/0086; G01S 7/52017

USPC .................................................. 367/140, 189
See application file for complete search history.

(56) References Cited

U.S. PATENT DOCUMENTS 8,299,550 B2    10/2012 Zaitsu
8,754,660 B2 *  6/2014 Kandori et al. ............... 324/686
(Continued)

FOREIGN PATENT DOCUMENTS

EP    1764162 A1    3/2007
JP    2004-350700 A   12/2004
(Continued)

OTHER PUBLICATIONS

U.S. Appl. No. 14/310,499, filed Jun. 20, 2014, Applicant: Atsushi Kandori.
(Continued)

*Primary Examiner* — Daniel Pihulic
(74) *Attorney, Agent, or Firm* — Fitzpatrick, Cella, Harper & Scinto

(57) ABSTRACT

An electromechanical transducer includes a plurality of cells arranged on a substrate, each cell having a first electrode and a second electrode disposed opposite to the first electrode with a gap interposed between them. A plurality of elements, each including at least two cells with their first electrodes or second electrodes electrically connected to each other, are arranged in the transducer. Vibration film structures that includes respective vibration films disposed above the substrate with a gap between them are arranged in the intervals which are devoid of elements separating the plurality of elements. With this structure, the non-uniformity of the radiation impedances of the plurality of elements due to the intervals separating the regions where the elements are respectively arranged can be reduced and hence the influence of the intervals separating the elements on the transmission/reception characteristics can also be reduced.

6 Claims, 9 Drawing Sheets

(51) Int. Cl.
*G01S 7/52* (2006.01)
*G01H 11/06* (2006.01)

(56) References Cited

U.S. PATENT DOCUMENTS

| | | | |
|---|---|---|---|
| 8,787,117 B2* | 7/2014 | Kandori | 367/189 |
| 8,953,414 B2* | 2/2015 | Kandori | 367/189 |
| 2011/0169510 A1* | 7/2011 | Kandori et al. | 324/686 |
| 2011/0182149 A1 | 7/2011 | Kandori | |
| 2012/0103096 A1 | 5/2012 | Kandori | |
| 2012/0194107 A1 | 8/2012 | Kandori et al. | |
| 2012/0218867 A1 | 8/2012 | Kandori et al. | |
| 2013/0021581 A1 | 1/2013 | Takahashi | |
| 2013/0064035 A1* | 3/2013 | Kandori | 367/189 |
| 2014/0007693 A1 | 1/2014 | Torashima et al. | |
| 2014/0010052 A1 | 1/2014 | Torashima et al. | |
| 2014/0010388 A1* | 1/2014 | Akiyama et al. | 381/191 |
| 2014/0251017 A1* | 9/2014 | Kandori | 73/661 |
| 2014/0285219 A1* | 9/2014 | Kandori et al. | 324/658 |
| 2014/0301167 A1* | 10/2014 | Kandori | 367/178 |
| 2015/0009778 A1* | 1/2015 | Kandori et al. | 367/7 |

FOREIGN PATENT DOCUMENTS

| | | |
|---|---|---|
| JP | 2010-172181 A | 8/2010 |
| JP | 2010-251847 A | 11/2010 |
| WO | 2008/136198 A1 | 11/2008 |
| WO | 2010/146838 A2 | 12/2010 |

OTHER PUBLICATIONS

U.S. Appl. No. 14/296,351, filed Jun. 4, 2014, Applicant: Atsushi Kandori.

PCT International Search Report and Written Opinion of the International Searching Authority, mailed Oct. 11, 2013, in PCT/JP2012/078265.

Alper Ozgurluk et al: "Radiation impedance of an array of circular capacitive micromachined ultrasonic transducers in collapsed state", Ultrasonics Symposium (IUS), 2011 IEEE International, IEEE, Oct. 18, 2011, pp. 1020-1023, XP032230614.

Knight J, McLean J, and Degertekin F L, 2004 "Low temperature fabrication of capacitive micromachined ultrasonic immersion wave transducers on silicon and dielectric substrates" (IEEE Trans. Ultrason., Ferroelect., Freq. Contr. 51 10 1324-1333).

International Preliminary Report on Patentability Chapter I, dated May 30, 2014, issued during prosecution of related International Application No. PCT/JP2012/078265.

* cited by examiner

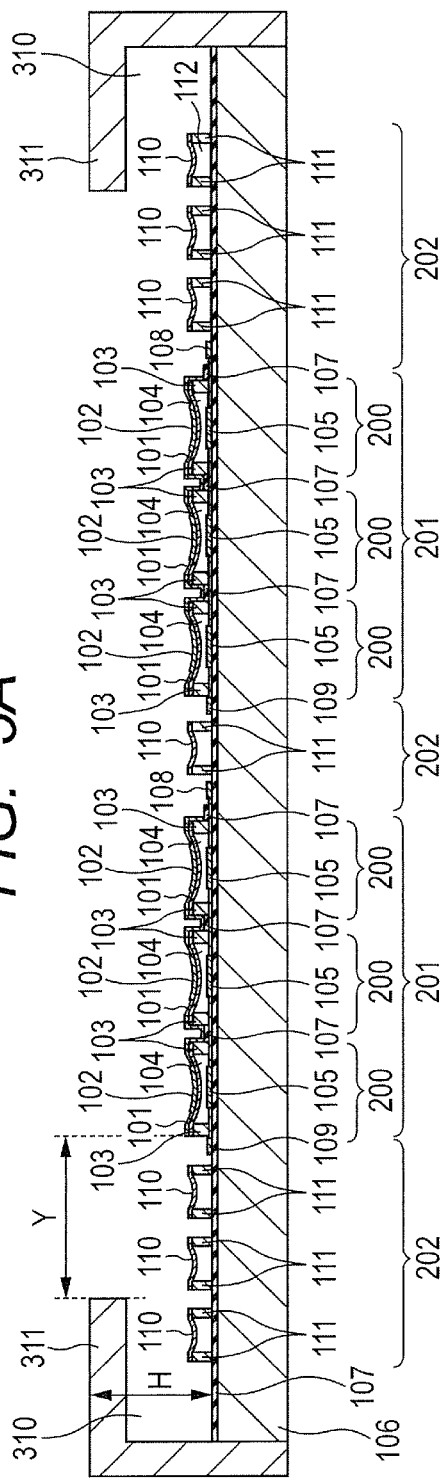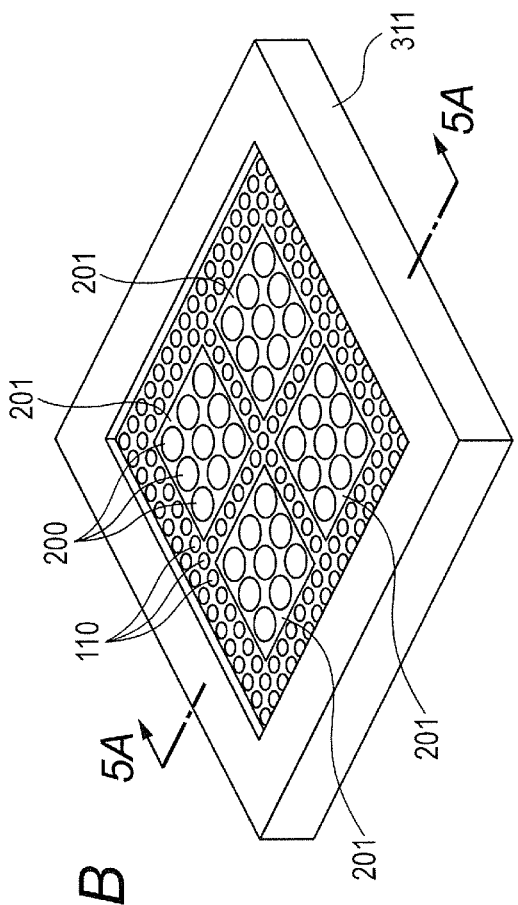

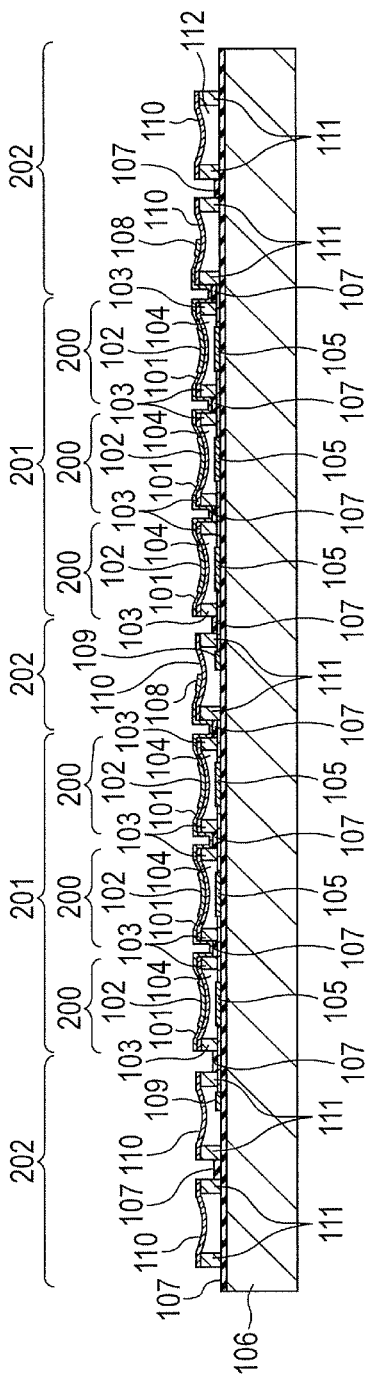
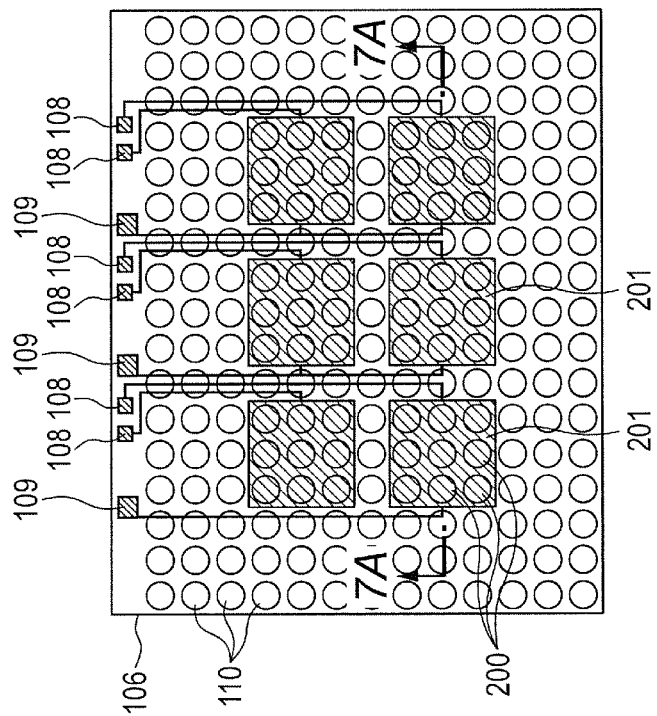
FIG. 7A
FIG. 7B

ELECTROMECHANICAL TRANSDUCER

TECHNICAL FIELD

The present invention relates to an electromechanical transducer such as an electrostatic capacity type electromechanical transducer for transmitting/receiving elastic waves such as ultrasonic waves (the expression of transmitting/receiving as used herein refers to at least one of transmitting and receiving).

BACKGROUND ART

Capacitive micromachined ultrasonic transducers (CMUTs) for transmitting/receiving ultrasonic waves have been proposed. A CMUT is prepared by means of a micro electromechanical systems (MEMS) process devised by applying semiconductor processes. FIG. 9A is a schematic cross-sectional view of a CMUT array and connections therein and FIG. 9B is a schematic illustration of a CMUT array on a substrate. FIG. 9A is a cross-sectional view taken along 9A-9A in FIG. 9B. The CMUT array in FIGS. 9A and 9B includes vibration films 101, first electrodes (upper electrodes) 102, supporting portions 103, gaps 104, second electrodes (lower electrodes) 105, a substrate 106 and insulating films 107. In FIG. 9B, each cell 200 is formed by a vibration film 101 and a supporting portion 103. A first electrode 102 is formed on the vibration film 101 and the vibration film 101 is supported by the supporting portion 103 that is formed so as to be disposed on the substrate 106. A second electrode 105 is arranged on the substrate 106 at a position opposite to the first electrode 102 formed on the vibration film 101, with a gap 104 (normally having a thickness of tens to hundreds of several nanometers) interposed between them. The surface of the substrate 106 on which CMUTs are formed (the upper surface in FIG. 9A) is referred to as CMUT-forming surface and the opposite surface (the lower surface in FIG. 9A) is referred to as non-CMUT-forming surface hereinafter. A set of a vibration film 101 (normally having a thickness of about tens of several micrometers), a first electrode and a second electrode, which is arranged opposite to the first electrode with a gap 104 interposed between them, is referred to as a cell 200. A plurality of cells in which the first electrodes 102 and the second electrodes 105 are respectively electrically connected is collectively referred to as an element 201 that operates as a unit for transmitting/receiving ultrasonic waves. The first electrodes and the second electrodes in the element are drawn out to the outside of the CMUT array by respective wiring lines 108 and 109 provided outside the element. Since insulating films 107 are arranged on the substrate 106 and the substrate 106 and the wiring lines 108 and 109 are mutually insulated, the wiring lines of different elements are also mutually and electrically insulated.

A DC potential applying unit 301 can apply a DC potential to the first electrodes (upper electrodes) 102 that are mutually connected by way of the wiring lines 108. As a result of making the first electrodes to show a predetermined potential by means of the DC potential applying unit 301, a predetermined DC potential difference VB is produced between each of the first electrodes and the oppositely disposed second electrode 102. Because of the potential difference VB between the electrodes, when the electrodes receive ultrasonic waves and the distance between them is changed accordingly, a dielectric current (charge) is generated on the electrodes. Then, electrostatic attraction is generated at the electrodes to bend the vibration film 101 toward the substrate 106 due to the predetermined potential difference VB between the electrodes. Consequently, the distance between the electrodes is reduced to raise the transmission/reception efficiency of the ultrasonic transmitting/receiving operation of the CMUT. A drive detecting unit 302 has at least one of an AC voltage applying unit for applying an AC voltage to the electrodes and a current detection unit for detecting the electric current generated at the electrodes. Therefore, the drive detecting unit 302 can apply an AC potential to the first electrodes (upper electrodes) 102 by way of the wiring lines 108 or detecting the generated electric current. Thus, by generating electrostatic attraction between the two electrodes by means of the applied AC voltage, the drive detecting unit 302 can operate for generating vibrations and transmitting elastic waves. The drive detecting unit 302 can also operate for detecting the magnitude of arriving elastic waves, detecting the change in the electric charge (electric current) due to a change in the capacity of the vibration film that is vibrating due the elastic waves.

As described above, wiring lines 108 and 109 need to be arranged for the purpose of exchanging electric signals from the electrodes with the outside, and hence the elements 201 of a CMUT array are arranged with certain intervals separating them.

CITATION LIST

Non Patent Literature

NPL 1: Knight J, McLean J, and Degertekin F L, 2004 "Low temperature fabrication of capacitive micromachined ultrasonic immersion wave transducers on silicon and dielectric substrates" (IEEE Trans. Ultrason., Ferroelect., Freq. Contr. 51 10 1324-1333)

SUMMARY OF INVENTION

Technical Problem

The transmission/reception characteristics of each cell 200 are influenced by the radiation impedance of the vibration film (membrane) the cell has. The radiation impedance of the vibration film of each cell changes as a function of the arrangement of the vibration film around the cell by way of the fluid surrounding the cell. Therefore, the radiation impedance of the vibration film each cell has varies between an instance where cells are arranged continuously and an instance where no cell is arranged in some regions and the substrate surface is held in contact with a medium there.

Furthermore, since, in order to arrange wiring lines there on a CMUT array, the elements 201 are arranged with intervals separating them, the radiation impedance of the vibration film of cell varies between cells arranged at the center of an element and cells arranged in a peripheral part of the element. In other words, concerning each of a plurality of elements arranged with intervals separating them, the transmission/reception characteristics of each cell 200 of the element 201 are influenced by the position in the element 201 where the cell is arranged. Then, the transmission/reception characteristics of the entire element 201 are degraded due to dispersion of characteristics among the cells. Thus, as described above, in a CMUT array formed by arranging a plurality of elements with intervals separating them, the transmission/reception characteristics of the elements are degraded due to the intervals. Therefore, an object of the present invention is to provide an electromechanical transducer formed by arranging a plurality of elements with intervals separating them, in which the transmission/reception characteristics of the elements are hardly influenced by the intervals separating them.

Solution to Problem

In view of the above-identified problem, according to the present invention, there is provided an electromechanical transducer characterized as follows. The electromechanical transducer includes a plurality of cells formed on a substrate, each having a first electrode and a second element arranged opposite to the first electrode with a gap interposed between them, and a plurality of elements, each being formed as a group of at least two cells whose first electrodes or the second electrodes are electrically connected. The radiation impedances of the plurality of elements are made to be equal to each other and vibration film structures including respective vibration films arranged with respective gaps separating them from the substrate are arranged at respective intervals on the substrate that are free from the plurality of elements.

Advantageous Effects of Invention

Thus, according to the present invention, since vibration film structures in an electromechanical transducer are arranged as described above, the non-uniformity of the radiation impedances of the plurality of elements due to the intervals separating the regions where the transmission/reception elements are respectively arranged can be reduced. Therefore, the present invention can provide an electromechanical transducer having transmission/reception characteristics that are hardly influenced by the intervals separating the plurality of transmission/reception elements thereof.

Further features of the present invention will become apparent from the following description of exemplary embodiments with reference to the attached drawings.

BRIEF DESCRIPTION OF DRAWINGS

FIGS. 5A and 5B are schematic illustrations of the electromechanical transducer according to the fifth embodiment.

FIGS. 7A and 7B are schematic illustrations of the electromechanical transducer according to the seventh embodiment.

DESCRIPTION OF EMBODIMENTS

Figure 1:
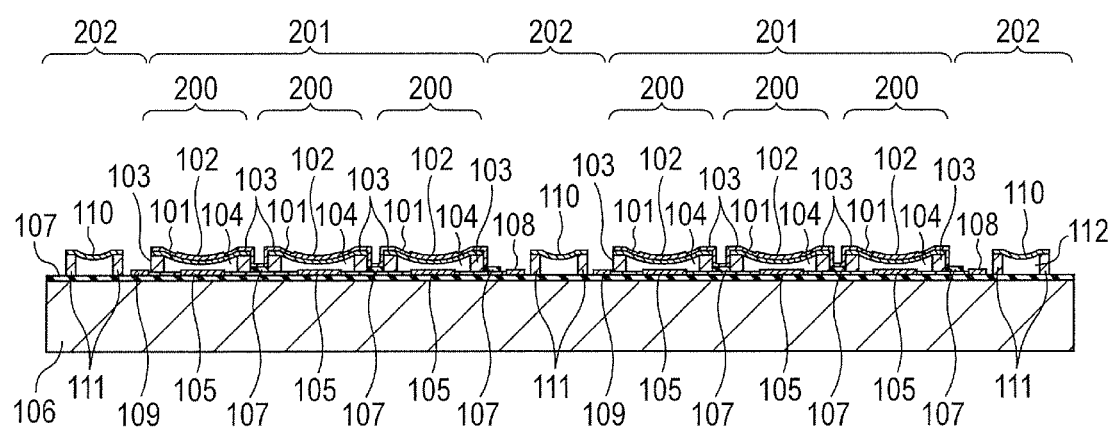
FIG. 1 is a schematic illustration of the electromechanical transducer according to the first embodiment of the present invention.

Now, embodiments of the present invention will be described in greater detail. The significance of the present invention lies in that vibration film structures, each including a vibration film arranged so as to produce a gap between itself and a substrate, are arranged also in the intervals, which portions being free from elements, between a plurality of elements arranged on the substrate. With such an arrangement, the radiation impedances of the elements that affect the conversion efficiency between mechanical vibrations and elastic waves can be made to be equal to each other. Typically, by making the radiation impedances of a plurality of cells in each element equal to each other, the radiation impedances of a plurality of elements can also be made to be equal to each other. More specifically, the surrounding structures of the cells in each element are made to be equal to each other so as to equalize the influences of their structure parameters on the acoustic impedances of the fluid surrounding them and, additionally, the structures of the cells are made to be equal to each other so as to make the radiation impedances that incorporate the respective acoustic impedances equal to each other. Note that the expression of "equal to" as used herein refers not only to completely the same as, and it can involve a negligible error therein.

The characteristics of a CMUT for a transmission/reception operation are determined by the radiation impedances of the vibration films 101 that each cell 200 has and the acoustic impedance of the medium held in contact with each cell 200 and each element 201. Note that the radiation impedance of the vibration film of a cell varies as a function of the mechanical characteristics of the vibration film 101 and the first electrode 102 and the field distribution characteristics between the first and second electrodes 102, 105 and further of the positions of the vibration films arranged around the cell due to the intervening fluid that surrounds the cell. In other words, the radiation impedance of a cell varies to a large extent between an instance where the cell that includes a vibration film is arranged in an element and an instance where the cell is not arranged in an element and the surface of the substrate 106 is (or the insulating film thereon, the wiring line and so on arranged thereon are) held in contact with the medium in a surrounding area. Since a plurality of elements are arranged with intervals 202 in an CMUT array, the radiation impedance of the vibration film of a cell varies between a central part and a peripheral part in an element, and hence the radiation impedance characteristics between the vibration film of the cell and the medium are non-uniform and vary as a function of the position of the cell in the element. This phenomenon arises even when the cells of an element have a same structure. The non-uniformity of radiation impedance characteristics causes non-uniformity of transmission/reception characteristics of the entire element to consequently deteriorate the transmission/reception characteristics. An electromechanical transducer according to the present invention is devised to solve these problems on the above-described concept and has a basic configuration as described earlier under Means for Solving the Problem.

The present invention will now be described in greater detail by referring to the accompanying drawings that illustrate embodiments of electromechanical transducer according to the invention. Note, the embodiments described below do not limit the scope of the present invention particularly in terms of the forms, the dimensions, the materials and the inter-element relative distances and it may be modified and/or altered in various different ways without departing from the spirit and scope of the invention. Additionally, if structurally feasible, any of the embodiments described below may be combined appropriately. For example, the structure of FIGS. 2A and 2B may be combined with that of FIGS. 5A and 5B or the structure of FIGS. 4A to 4C may be combined with that of FIGS. 5A and 5B.

First Embodiment

FIG. 1 shows a schematic cross-sectional view of the first embodiment. Referring to FIG. 1, the electromechanical transducer includes vibration films 101, first electrodes (upper electrodes) 102, vibration film supporting portions 103, gaps (gaps under reduced pressure relative to the atmospheric pressure, gaps filled with gas, etc.) 104 of cells 200 that form elements 201, second electrodes (lower electrodes) 105, a substrate 106, insulating films 107, wiring lines 108 of the first electrodes and wiring lines 109 of the second electrodes. The electromechanical transducer additionally includes vibration films 110 of vibration film structures, vibration film supporting portions 111 for vibration films 110 and gaps 112 of vibration film structures, which do not form the element 201. An insulating film 107 is arranged on the substrate 106 and the second electrodes 105 are arranged on the insulating film 107. A vibration film 101 is supported by a vibration film supporting portion 103 and disposed opposite to a second electrode 105 with a gap 104 interposed between them. A first electrode 102 is arranged opposite to the second electrode 105 on the vibration film 101 and vibrates integrally with the vibration film 101.

Either one of the first electrodes 102 or the second electrodes 105 are electrically connected as a whole so as to have a common electric potential. In the following description, the electrodes having a common electric potential are referred to as common electrode and the second electrodes 105 constitute a common electrode therein. The second electrodes 105 (common electrode) are connected to a DC potential applying unit 301 (see FIG. 9A) that can apply a desired electric potential by way of the wiring lines 109 of the second electrodes to produce a predetermined DC potential difference VB between the second electrodes 105 and the oppositely disposed first electrodes 102. Either one of the first electrodes 102 or the second electrodes 105 that are not the common electrode are divided into cell groups (which are referred to as elements 201 herein) and the electrodes in each cell group are electrically connected to each other so as to be at a same electric potential level. In the following description, the electrodes that are divided into groups (elements) so as to be at a same electric potential level in each group are referred to signaling electrodes and the first electrodes 102 are signaling electrodes therein.

Figure 9A:
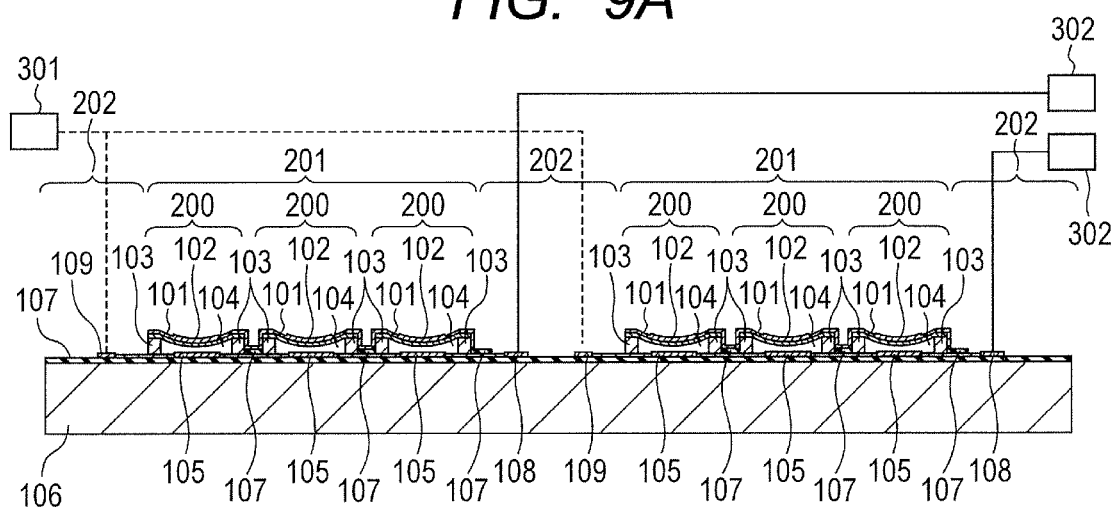
FIGS. 9A and 9B are schematic illustrations of a known electromechanical transducer.
Figure 9B:
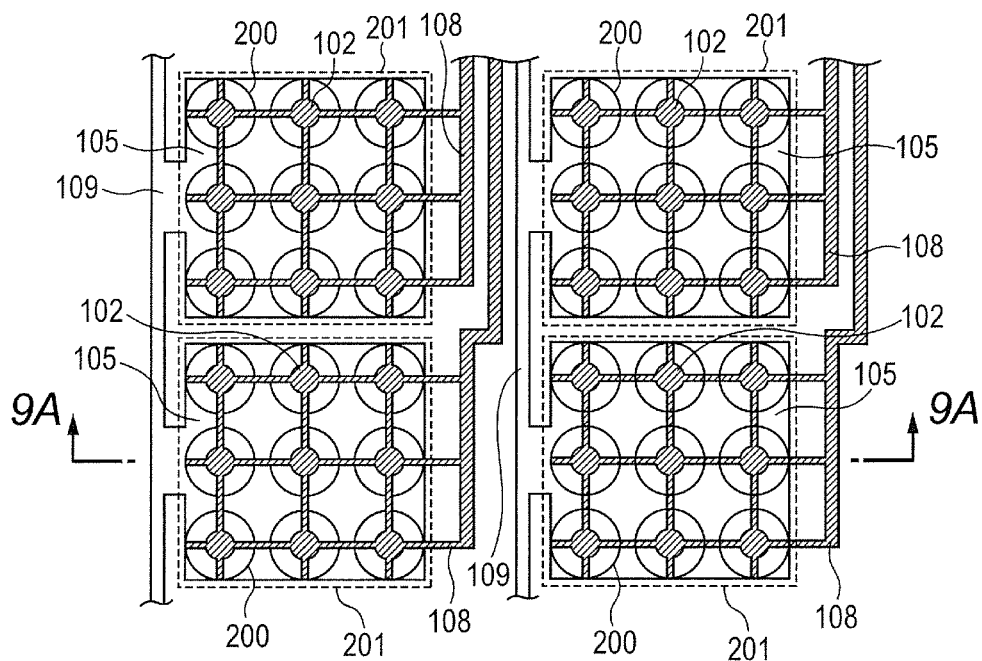

The first electrodes (signaling electrodes) 102 are connected to a drive detecting unit 302 by way of the respective wiring lines 108 (see FIG. 9A). The CMUT can execute either a transmission operation or a reception operation by driving the drive detecting unit 302 to operate.

The expression of a transmission operation as used herein refers to an operation of the drive detecting unit 302 of generating an AC voltage and applying the AC voltage to the first electrodes 102, thereby generating AC electrostatic attraction between the respective first electrodes 102 and second electrodes 105 and causing the vibration films 101 that are integral with the respective first electrodes 102 to vibrate in order to send out (transmit) elastic waves to the outside.

The expression of a reception operation as used herein refers to an operation of receiving elastic waves to cause the first electrodes 102, which are integral with the respective vibration films, to vibrate so as to consequently change the capacity between the respective first electrodes 102 and respective second electrodes 105, thereby changing the charges induced in the first electrodes 102 to generate an electric current so that the drive detecting unit 302 detects the electric current and hence detects (receives) the magnitude of the received elastic waves.

As described above, the electromechanical transducer of this embodiment includes a plurality of cells formed on a substrate, each of which has a second electrode and a vibration film including a first electrode and disposed opposite to the second electrode with a gap interposed between them. A drive detecting unit executes at least the function of transmitting elastic waves by causing the first electrodes to vibrate or the function of receiving elastic waves, which cause the first electrode to vibrate. The electromechanical transducer further includes a plurality of elements, or cell groups, each of which has a plurality of cells of which at least the first electrodes or the second electrodes are commonly connected to the drive detecting unit by way of wiring lines. In other words, an element is a group of cells whose first electrodes or second electrodes are electrically connected to each other. Additionally, vibration film structures, each including a vibration film arranged opposite to the substrate with a gap interposed between them, are arranged in a plurality of regions where no elements are arranged.

As pointed out above, for a CMUT to execute a transmission/reception operation, wiring lines 108 and wiring lines 109 need to be connected respectively to the first electrodes 102 and the second electrodes 105 and the plurality of elements 201 that operate for transmitting/receiving elastic waves are arranged in array with certain intervals 202 separating them. Such an array may be formed, for example, by arranging elements, each having a rectangular region, in a row or a plurality of rows, or by arranging elements, each having a square region, two dimensionally.

The characteristics of a CMUT for executing a transmission/reception operation are determined by the radiation impedances of the vibration films 101 that the cells 200 have and the acoustic impedance of the medium that is held in contact with the cells 200 and the elements 201. In a CMUT array, a number of elements are arranged with certain intervals 202 separating them. Therefore, if the intervals 202 are left as bare intervals, the radiation impedance characteristics between the vibration film of each of the cells in an element and the medium become non-uniform and vary as a function of the position of the cell in the element if the cells have a same structure.

In this embodiment, by arranging structures that have a vibration film 110 (vibration film structures having no electrodes) in the intervals 202 separating the elements, the radiation impedance of the vibration film 101 of a cell in a central part of an element and that of the vibration film 101 of a cell in a peripheral part of the element can be brought close to each other. Then, as a result, the influence of the intervals 202 separating the elements on the transmission/reception characteristics can be reduced. As described above, this embodiment can provide an electromechanical transducer having transmission/reception characteristics that are hardly influenced by the intervals 202 separating the plurality of transmission/reception elements thereof.

In this embodiment, the thickness, the size, the material and the arrangement intervals of the vibration films 110 arranged in the intervals 202 separating the elements thereof are desirably made to be as equal as possible to those of the vibration films 101 arranged in the elements 201. Then, as a result, the radiation impedances of the intervals 202 separating the elements can be brought closer to those of the cells in the elements. Thus, transmission/reception characteristics that are hardly influenced by the intervals 202 separating the plurality of elements can be obtained.

Second Embodiment

Figure 2A:
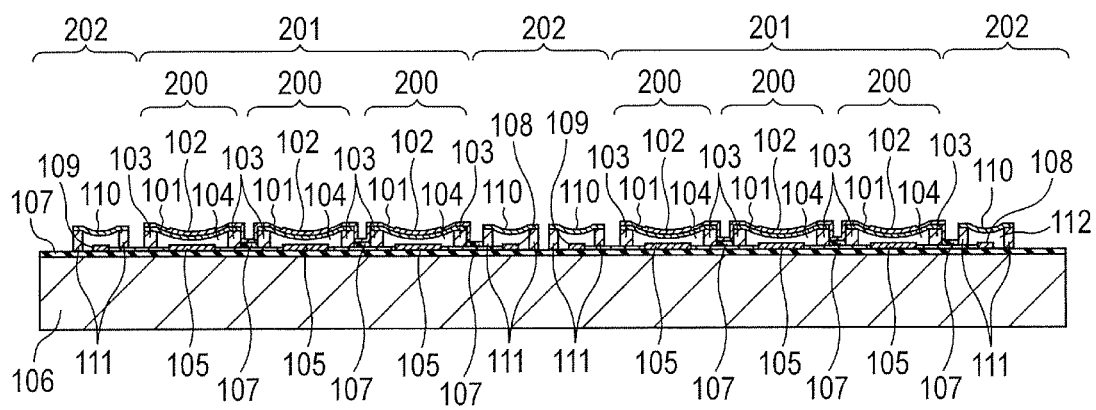
FIGS. 2A and 2B are schematic illustrations of the electromechanical transducer according to the second embodiment.
Figure 2B:
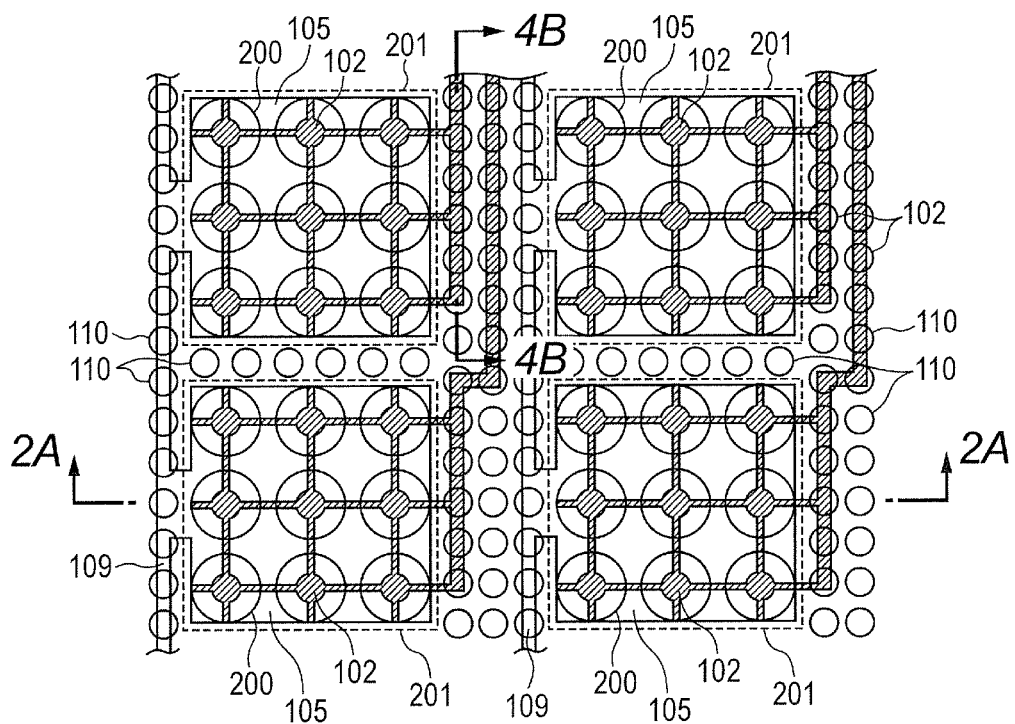

Referring to FIG. 2, the second embodiment differs from the first embodiment in terms of the wiring lines arranged in the intervals 202 separating the elements thereof. Otherwise, this embodiment is same as the first embodiment. One of characterized feature of this embodiment is a configuration that vibration films 110 are formed on wiring lines 108 and 109 arranged in the intervals separating the elements thereof. FIG. 2A is a schematic cross-sectional view of the CMUT array and FIG. 2B is a schematic illustration of the CMUT array on a substrate. FIG. 2A illustrates a cross-sectional view taken along 2A-2A in FIG. 2B. In FIGS. 2A and 2B, wiring lines 108 and 109 are arranged in the intervals 202 separating a plurality of elements of the CMUT array. Note that a one-row vibration film structures having no wiring lines that is arranged in an interval 202 separating elements is omitted in FIG. 2A.

These wiring lines 108 and 109 are arranged on the substrate 106 in a state where they are insulated from the substrate 106 by an insulating film 107. More specifically, each element is provided with a wiring line 108 for connecting signaling electrodes 102 to a drive detecting unit 302 and a wiring line 109 for a connecting common electrode 105 to a DC potential applying unit 301. The wiring lines 108 and 109 are drawn out to an outer peripheral part of the substrate 106 and the former wiring lines 108 are connected to the drive detecting unit 302, while the latter wiring lines 109 are connected to the DC potential applying unit 301. In this embodiment, vibration films 110 are respectively supported on vibration film supporting portions 111 so as to be located above the wiring lines with gaps 112 interposed between them. As a result of providing the vibration films 110, the radiation impedances of the vibration films 110 in the regions where the wiring lines 108 and 109 are arranged can be made equal to the radiation impedances of the vibration films 101 in the elements. Additionally, since the vibration films 110 can be arranged in the regions where the wiring lines are arranged, the intervals separating the plurality of elements can be reduced when compared with the first embodiment.

Besides, no wiring lines 108 and 109 are found on the vibration films 110 in the intervals 202 separating the elements. With this arrangement, transmission/reception noises hardly occur from the wiring lines when the vibration films 110 vibrate so that the transmission/reception characteristics are not deteriorated by the noises.

Considering an instance where wiring lines are arranged respectively on vibration films 110 that are disposed opposite to the wiring lines arranged in the intervals separating elements and show an electric potential level different from each other. With such an arrangement, when a signal to be transmitted is applied to some of the wiring lines, the vibration films 110 on those wiring lines vibrate and elastic waves are transmitted from regions other than the regions of any desired elements. This means that noises are superposed on a desired signal to be transmitted to deteriorate the transmission characteristics. Additionally, when executing a reception operation, as the vibration films 110 on the wiring lines receive elastic waves and vibrate, a charge is induced on the wiring lines and a signal formed due to the vibrations of the parts other than the region of any signal receiving element is added to a received signal. Thus, the noises received by the wiring lines are superposed on the proper received signal to consequently deteriorate the reception characteristics.

In this embodiment, on the other hand, no wiring lines are arranged on the vibration films 110 in the intervals separating the elements so that the vibration films 110 do not vibrate when a transmitted signal is applied to the wiring lines. Additionally, no charge is induced if the vibration films 110 vibrate. Thus, when this embodiment is employed, the transmission/reception characteristics thereof are not deteriorated by noises generated in any of the wiring lines if the vibration films 110 are formed on the wiring lines in the intervals 202 separating the plurality elements. In other words, since the vibration films 110 are arranged on the wiring lines in the intervals separating the transmission/reception elements in this embodiment, the electromechanical transducer is hardly influenced by the wiring lines arranged in the intervals 202 separating a plurality of transmission/reception elements.

In this embodiment, the width of the wiring lines 108 and 109 arranged in the intervals 202 separating the elements may be greater than the size of the vibration films 110. With such an arrangement, each of the supporting portions 111 that respectively support the vibration films 110 can be formed on a wiring line having a uniform surface disposed at a same height (without any step). For this reason, the supporting portions 111 and the vibration films 110 thereon can be formed uniformly with ease and the mechanical characteristics of the vibration films 110 in the intervals 202 separating the elements can be made to show values that are close to desired values. Then, the impedances in the regions of the intervals separating the elements where wiring lines are arranged can be brought closer to the radiation impedances in the elements with ease. Thus, this embodiment can provide an electromechanical transducer that is hardly influenced by the wiring lines arranged in the intervals separating a plurality of transmission/reception elements.

Third Embodiment

Figure 3:
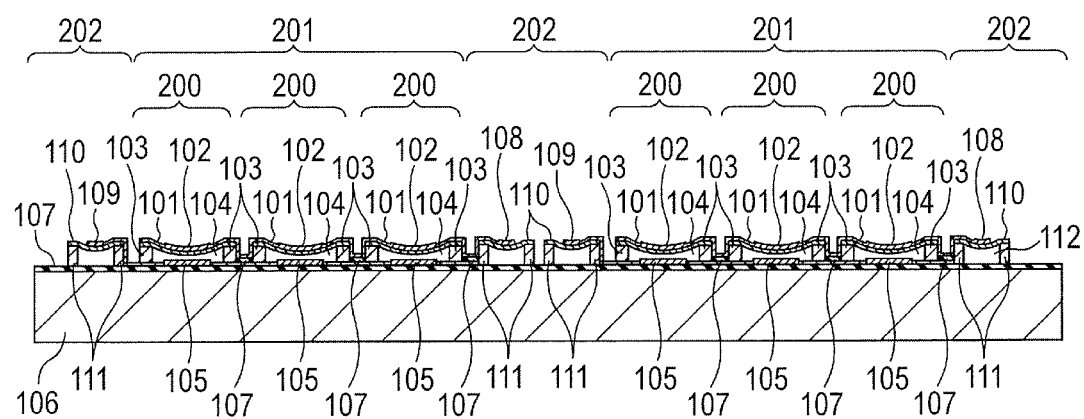
FIG. 3 is a schematic illustration of the electromechanical transducer according to the third embodiment.

Referring to FIG. 3, the third embodiment of the present invention differs from the first embodiment in terms of the wiring lines arranged in the intervals separating the elements thereof. Otherwise, this embodiment is same as the first embodiment. This embodiment is characterized by a configuration where wiring lines 108 and 109 are respectively formed on the vibration films 110 that are arranged in the intervals separating elements and no wiring lines are arranged on a substrate 106 disposed opposite to the vibration films. In FIG. 3, vibration films 110 are supported by respective vibration film supporting portions 111 and arranged in the intervals separating a plurality of elements of the CMUT array of this embodiment above the substrate 106 with a gap 112 interposed between each of the vibration films 110 and the substrate 106. Wiring lines 108 and 109 are formed on the vibration films 110 to provide a structure where they vibrate with the vibration films 110. Since the configuration of forming wiring lines on vibration films 101 produces a structure same as the structure of each cell in each element, the acoustic impedance of the medium in the intervals 202 separating the elements can be brought closer to the impedances in the elements.

The vibration films 110 arranged in the intervals separating the elements and the wiring lines arranged on them desirably have mechanical (spring) characteristics equal to those of the cells arranged in the elements. More specifically, mechanical characteristics that are close to those of the cells arranged in the elements can be obtained for the wiring lines on the vibration films 110 by making the thickness, the size, the material and the arrangement intervals of the vibration films 110 as equal as possible to those in the elements and additionally by making the material, the thickness and so on of the wiring lines on the vibration films 110 equal to those of the wiring lines in the elements. The parameters of the vibration films 110, those of the wiring lines 108 and those of the wiring lines 109 may differ from one another so long as the mechanical characteristics of the vibration films and those of the wiring lines as combined are close to the mechanical characteristics of their counterparts in the elements. Since wiring lines are formed on the vibration films 110 arranged in the intervals separating the elements in this embodiment, even if wiring lines are arranged in the intervals of a plurality of transmission/reception elements, this embodiment can provide an electromechanical transducer that is hardly influenced by them. Thus, as described above, wiring lines are arranged at the vibration films of the vibration film structures or in the regions of the substrate disposed opposite to the vibration films of the vibration film structures.

Figure 4A:
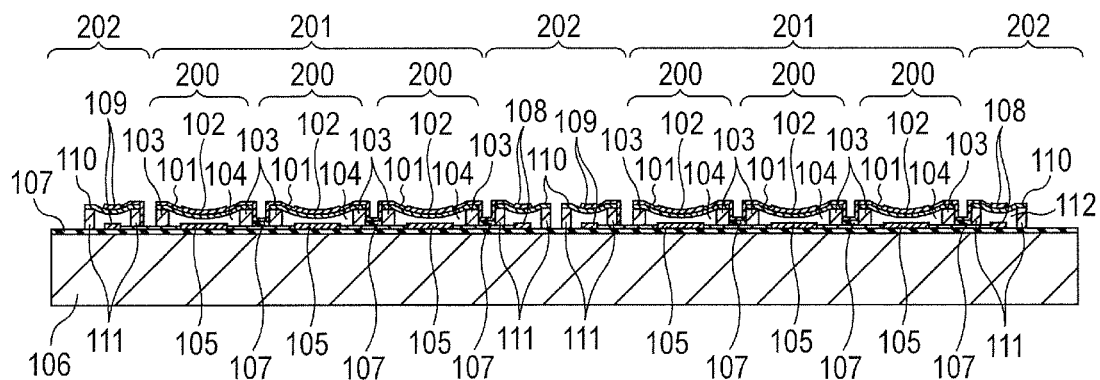
FIGS. 4A, 4B and 4C are schematic illustrations of the electromechanical transducer according to the fourth embodiment.
Figure 4B:
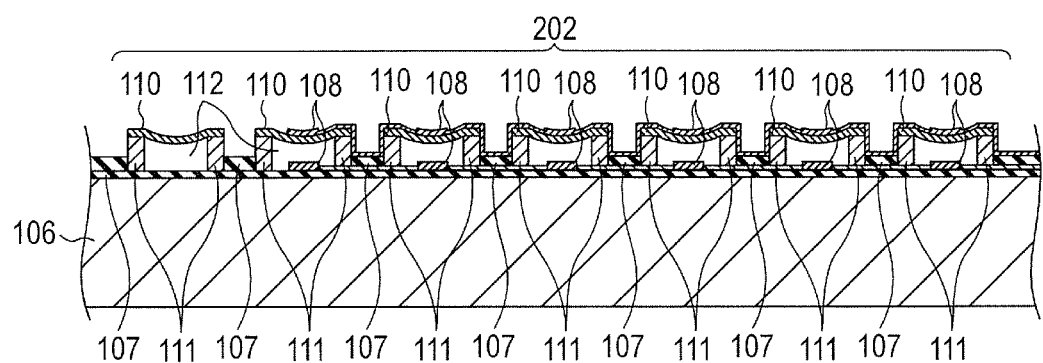
Figure 4C:
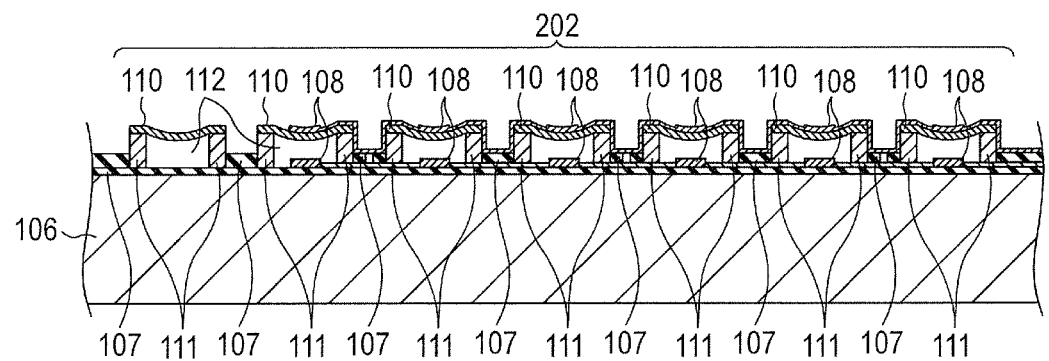

Fourth Embodiment referring to FIGS. 4A through 4C, the fourth embodiment of the present invention differs from the first to third embodiments in terms of the wiring lines arranged in the intervals separating the elements thereof. Otherwise, this embodiment is same as any of the first to third embodiments. In this embodiment, vibration films 110 are formed on the wiring lines arranged in the intervals 202 separating the elements thereof and wiring lines are additionally formed on the vibration films 110. Each paired wiring lines 108 and 108 or 109 and 109 disposed opposite to each other with a gap 112 interposed between them have a same electric potential. In other words, in this embodiment, wiring lines are arranged in the regions of the vibration films of the vibration film structures and also in the regions of the substrate disposed opposite to the vibration films of the vibration film structures and both the wiring lines on the vibration films of the vibration film structures and the wiling lines on the regions of the substrate disposed opposite to the vibration films of the vibration film structures are held to a same electric potential level.

FIG. 4A is a schematic cross-sectional view of the CMUT array of this embodiment and FIG. 4B is a schematic cross-sectional view of the gap 202 in this embodiment taken along 4B-4B of FIG. 2B. In FIG. 4A, first wiring lines are arranged between adjacent elements on the substrate 106 and insulated from the substrate 106. Vibration films 110 are supported respectively above the wiring lines by supporting portions 111 with gaps 112 interposed between them. Second wiring lines are arranged respectively on the vibration films 110, and the first wiring lines and the second wiring lines are electrically separated from each other by an insulating film 107 in areas other than those of the vibration films 110. This structure is same as the cell structure of the elements and hence can be prepared simultaneously at the time of forming the CMUT array. The first wiring lines and the second wiring lines are electrically connected to each other in a peripheral part of the substrate 106 to make them show a same electric potential level.

Since the first wiring lines are arranged on the substrate 106, the supporting portions 111 for supporting the vibration films 110 can be formed on the wiring lines having a same height (without any step) and uniform surfaces. Thus, the supporting portions 111 and the vibration films 110 thereon can be formed uniformly with ease so that the mechanical characteristics of the vibration films 110 arranged in the intervals separating the elements can be made close to desired values. Additionally, since the vibration films 110 arranged in the intervals separating the elements and the second wiring lines arranged thereon can be made to be structurally equal to the cells arranged in the elements, the mechanical characteristics thereof can be made close to those of the cells with ease.

On the other hand, since the first wiring lines and the second wiring lines are made to show a same electric potential level, the vibration films 110 do not vibrate if a signal to be transmitted is applied to any of the wiring lines and conversely no charge is induced if any of the vibration films 110 vibrate. In other words, when this embodiment is employed, the transmission/reception characteristics thereof are not deteriorated by noises in any of the wiring lines if vibration films 110 that are provided with wiring lines are formed with gaps 111 on the wiring lines between the elements. Thus, in this embodiment, no noise is generated by any of the wiring lines if the embodiment is made to have a structure where the radiation impedances of the intervals separating the elements can be brought close to those in the elements. Therefore, this embodiment can provide an electromechanical transducer that is hardly influenced by an arrangement where wiring lines are arranged in the intervals separating a plurality of transmission/reception elements.

This embodiment can be modified so as to connect the first wiring lines and the second wiring lines in an area other than a peripheral part on the substrate 106. More specifically, as shown in FIG. 4C, the insulating film 107 for insulating the first wiring lines from the second wiring lines that are found between adjacent vibration films 110 arranged in the intervals separating the elements is partly removed and hence the first and second wiring lines can be connected in such parts. Note that FIG. 4C is a schematic cross-sectional view of the gap 202 in this embodiment taken along 4B-4B of FIG. 2B. With this arrangement, the resistance of the wiring lines can be reduced so that deterioration of any received signal/signal to be transmitted due to the wiring lines can be alleviated. Thus, this modified embodiment can provide an electromechanical transducer that is less subjected to deterioration of the transmission/reception characteristics.

Fifth Embodiment

Referring to FIGS. 5A and 5B, the fifth embodiment of the present invention differs from the first to fourth embodiments in terms of the vibration films 110 arranged in areas other than the intervals separating the elements thereof. Otherwise, this embodiment is same as any of the preceding embodiments. FIG. 5A is a schematic cross-sectional view of the CMUT array of this embodiment and FIG. 5B is a schematic illustration of sound insulation portion 311 of the embodiment. FIG. 5A is a cross-sectional view taken along 5A-5A in FIG. 5B. In FIGS. 5A and 5B, the electromechanical transducer has a sound insulation portion 311. FIG. 5B shows only cells 200, elements 201, vibration films 110 and sound insulation portion 311 and all the remaining components are omitted.

In this embodiment, vibration films 110 are arranged also in a peripheral region of substrate 106 where no elements (transmission/reception elements) are arranged. Additionally, a sound insulation portion 311 is arranged at a peripheral part of the substrate 106 with a gap 310. When receiving elastic waves, the sound insulation portion 311 is shielded against elastic waves and hence no elastic waves get onto the substrate 106 in that part. The vibration films 110 that are arranged in a peripheral region of the substrate 106 are so arranged as to partly overlap the region where the sound insulation portion 311 is arranged. Thus, one or more vibration films 110 are found without fail in the region where elastic waves get to the substrate 106 from the outside. Therefore, the cells 200 and the vibration films 101 have substantially uniform mechanical characteristics on the substrate 106 in the region where elastic waves get to the substrate 106 and hence their radiation impedances that are influenced by the mechanical characteristics are equal to each other. For this reason, there is not any place where the radiation impedances of the vibration films are non-uniform or the radiation impedances vary to a large extent within the range where elastic waves get to. Thus, deterioration of the reception characteristics can be suppressed regardless of the positions of arrangement of elements on the substrate.

Furthermore, this embodiment is so configured as to prevent elastic waves to hit any exposed surface area of the substrate and the edge of any region where cells 200 or vibration films 110 are arranged. Therefore, noises that are otherwise generated at the time of signal reception as a result of reflection of input elastic waves at places that are devoid of cells 200 or vibration films 110 hardly occur. Thus, deterioration of the reception characteristics can be suppressed.

Besides, the sound insulation portion 311 is so arranged that, when an element executes a transmission operation, the transmitted elastic waves do not directly hit the sound insulation portion 311. More specifically, the distance separating the sound insulation portion 311 from the substrate region where the elements 201 are arranged can be determined by considering the expansion of the main lobe of the transmitted sound wave that is determined by the element size and the frequency when transmitting elastic waves from the element. Assume here that the length of each side of the elements is 2a(m), the lower limit frequency of the transmitted sound wave is f(Hz), while the sound velocity is C(m/s) and the distance from the upper surface of the substrate to the upper surface of the sound insulation portion is H(m). Then, the distance Y(m) from the outermost peripheral edges of the elements arranged along the outermost periphery to the sound insulation portion 301 desirably satisfies the requirement of formula (1) shown below:

$$Y = H \times \tan(|\sin((2\pi \times f/c) \times a \times \sin\theta)/((2\pi \times f/c) \times a \times \sin\theta|) \quad (1).$$

With an arrangement that satisfies the requirement of the formula (1), better transmission characteristics can be obtained without outputting elastic waves other than the transmitted main lobe waveforms to the outside of the electrostatic capacity type electromechanical transducer at the time of a transmission operation.

As described above, as a result of arranging a sound insulation portion 311, the radiation impedances in the region that receives elastic waves at the time of a reception operation are equal to each other and reflections of elastic waves that are apt to generate reception noises hardly occur. Additionally, at the time of a transmission operation, the radiation impedances of the elements used for transmission are equal to each other regardless of positions and transmission noises other than the desired transmission wave can be reduced. Materials including metals such as aluminum and resin materials such as acryl that can reflect elastic waves in a predetermined frequency region to be used for transmission/reception can be used for the sound insulation portion 311. The effect of reflection can be boosted by increasing the difference between the acoustic impedance of the material selected to reflect elastic waves and the acoustic impedance of the medium.

Since vibration films 110 are arranged in areas where sounds outside the transmission/reception elements do not arrive (or are not emitted) in this embodiment, any non-uniformity of the radiation impedances around the elements arranged along the outermost periphery of the substrate that can influence the transmission/reception characteristics can be reduced. Therefore, this embodiment can provide an electromechanical transducer in which the transmission/reception elements arranged along the outermost periphery are more hardly influenced by the peripheral region where no element is arranged.

Sixth Embodiment

Figure 6:
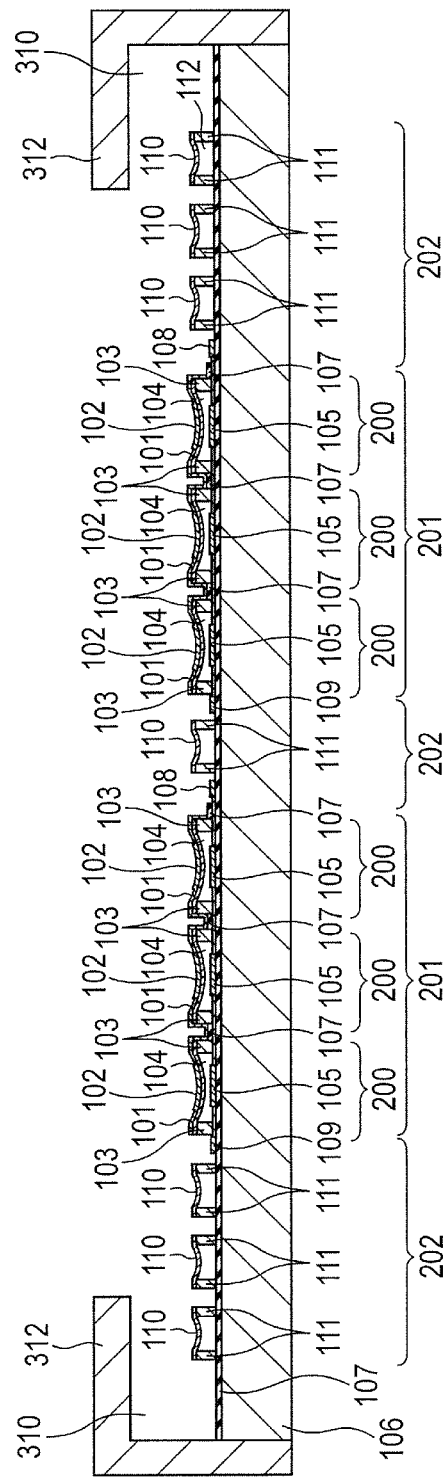
FIG. 6 is a schematic illustration of the electromechanical transducer according to the sixth embodiment.

Referring to FIG. 6, the sixth embodiment of the present invention differs from the fifth embodiment in terms of the vibration films 110 arranged in areas other than the intervals separating the elements thereof. Otherwise, this embodiment is same as the fifth embodiment. FIG. 6 is a schematic cross-sectional view of the CMUT array of this embodiment. Referring to FIG. 6, the electromechanical transducer has a sound absorption member 312. The sound absorption member 312 is arranged at the position where the sound insulation portion 311 is arranged in the fifth embodiment. In a predetermined frequency region for transmission/reception, the sound absorption member 312 can absorb elastic waves arriving to the surface of the sound absorption member 312 and attenuate them to a predetermined level in the inside. The sound absorption member 312 is arranged above a peripheral region of the substrate where vibration films 110 are arranged. The sound absorption member 312 can absorb all the elastic waves that get to the surface of the sound absorption member by selecting a substance having an acoustic impedance that is close to the acoustic impedance of the medium. The sound absorption member 312 can be made to have a constitution that can easily attenuate the elastic wave penetrating into the inside thereof by arranging particles of metal or some other substance in the inside of the sound absorption member 312 in a dispersed state.

When an electromechanical transducer according to the present invention employs a sound insulation member 311 and elastic waves enters the sound insulation member 311 at the time of reception, elastic waves may be reflected at some of the edges to influence the reception operation as noise. On the other hand, in an electromechanical transducer according to the present invention and including a sound absorption member 312, elastic waves are absorbed and attenuated at the part thereof where the sound absorption member 312 is located so that elastic waves reflected at the surface of the sound absorption member 312 hardly get to the regions other than the regions where vibration films 110 are arranged. Thus, no elastic waves get to the boundaries and their vicinities of the regions where vibration films 110 are arranged and the regions where no vibration films 110 are arranged. Therefore, no noise is generated at the areas where radiation impedances are non-uniform (areas devoid of cells or vibration films 110). When executing a transmission operation, although the amount is not so large, the transmitted waveforms of the side lobe are transmitted with an angle greater than the main lobe, other than the transmitted waveforms of the main lobe. As the transmitted sound pressure of the side lobe is reflected, the overall transmission characteristics can be influenced. However, if the side lobe of the transmitted waveforms hits the sound absorption member 302 of this embodiment, the sound absorption member 302 absorbs and attenuates the side lobe and hence the side lobe is neither returned onto the substrate 106 nor transmitted in the outward direction of transmission to become transmission noise.

A region where no sound arrives (or goes out) is formed outside the transmission/reception elements by the sound absorption member 312 of this embodiment and vibration films 110 are arranged so as to be superimposed on that region. Therefore, non-uniformity of the radiation impedances around the elements arranged along the outermost periphery of the substrate can be reduced so as not to influence the transmission/reception characteristics. Thus, this embodiment can provide an electromechanical transducer in which the transmission/reception elements arranged along the outermost periphery are more hardly influenced by the peripheral region where no element is arranged. As described above, a sound insulation portion and a sound absorption portion that respectively isolates elastic waves and absorbs and attenuates elastic waves are arranged by way of a substrate and a gap in the fifth and sixth embodiments. The region where the sound insulation portion or the sound absorption portion is not arranged is included in the region where a plurality of elements is arranged on the substrate as viewed from a direction perpendicular to the surface of the substrate.

Seventh Embodiment

Referring to FIGS. 7A and 7B, the seventh embodiment of the present invention differs from the first to sixth embodiments in terms of the vibration films 101 and 110 arranged in the elements and at other than the elements. Otherwise, this embodiment is same as any of the first through sixth embodiments. FIG. 7A is a schematic cross-sectional view of the CMUT array of this embodiment and its connections, and FIG. 7B is a schematic illustration of the CMUT array on a substrate. FIG. 7A is a cross-sectional view taken along 7A-7A in FIG. 7B. In FIG. 7B, vibration films 101 and supporting portions 103 are illustrated as cells 200, and first and second electrodes are omitted. A vibration film 110 and a supporting portion 111 are represented by a numeral 110 in a simplified manner.

In this embodiment, vibration films 110 (101) having a same shape are arranged uniformly at the same periodicity on a substrate 106. In other words, the vibration films of the vibration film structures and the vibration films of the cells have a same shape and arranged at a same periodicity. Since vibration films 110 (101) having a same shape are arranged uniformly, the mechanical characteristics of the vibration films 110 (101) on the substrate 106 are equal for all the vibration films. Therefore, in the region on the substrate 106 where vibration films 110 (101) are formed, the radiation impedances of the substrate 106 or the radiation impedances of the vibration films 110 (101) can be made almost equal. Therefore, regardless of the location of the region where the transmission/reception elements are arranged, the radiation impedances of the elements are hardly influenced by the region. As a result, in the region where the vibration films 110 (101) are arranged on the substrate 106, there can hardly arise a situation where the radiation impedances become non-uniform due to the positions of arrangement of the transmission/reception elements to deteriorate the transmission/reception characteristics.

Since vibration films having a same shape are arranged periodically on a substrate in this embodiment, this embodiment can provide an electromechanical transducer whose transmission/reception characteristics are hardly deteriorated regardless of the intervals and positions of arrangement of transmission/reception elements.

Eighth Embodiment

The eighth embodiment of the present invention is an ultrasonic instrument using an electrostatic capacity type electromechanical transducer of any of the first through seventh embodiments.

Figure 8A:
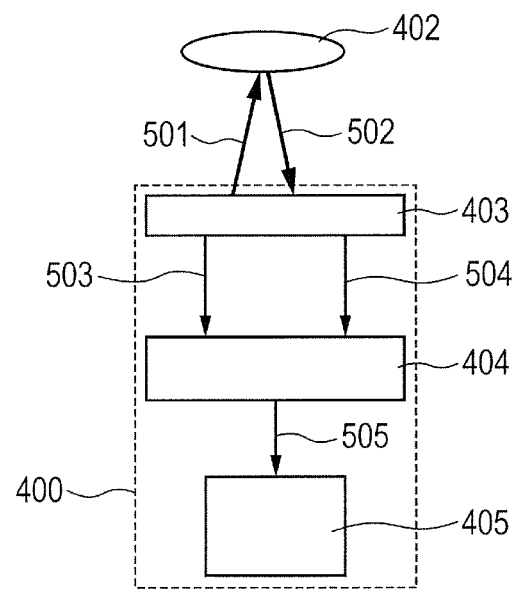
FIGS. 8A and 8B are schematic illustrations of the electromechanical transducer according to the eighth embodiment.

Referring to FIG. 8A, ultrasonic waves 501 output from an electromechanical transducer 403 of the ultrasonic instrument 400 toward an object of measurement 402 are reflected by the surface of the object of measurement 402 due to the difference of characteristic acoustic impedance at the boundary surface thereof. The reflected ultrasonic waves 502 are received by the electromechanical transducer 403 and information 504 on size, shape and time of the received signal is sent to image information generator 404. Separately, information 503 on size, shape and time of the transmitted ultrasonic wave is sent to the image information generator 404. The image information generator 404 generates an image signal on the object of measurement 402 on the basis of the received ultrasonic signal 504 and the information 503 on the transmitted ultrasonic signal and sends the image signal out as image information to be reproduced 505, which is then displayed on an image display 405. Thus, the instrument of this embodiment includes an electromechanical transducer that operates at least one of transmitting elastic waves and receiving elastic waves and an image information generator that operates to generate image information on an object of measurement, using at least one of information of a signal transmitted from and information of a signal received by the electromechanical transducer.

Figure 8B:
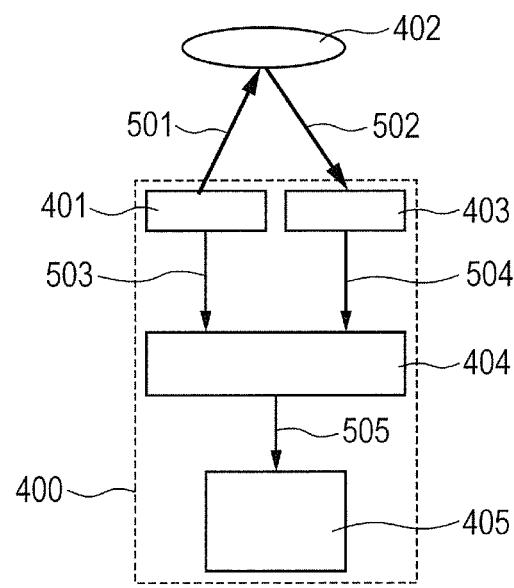

A CMUT of any of the above-described embodiments is employed in the electromechanical transducer 403 of this embodiment. Then, as a result, the transducer can execute transmission operations and/or reception operations with excellent operation characteristics because the operations are hardly influenced by the intervals separating a plurality of transmission/reception elements. Then, accurate information can be acquired from ultrasonic waves 502 reflected by an object of measurement 402 and hence an image of the object of measurement 402 can be reproduced accurately. Note, however, that the configuration of this embodiment is by no means limited to the above-described one and an electromechanical transducer 403 according to the present invention and some other ultrasonic transmitter (elastic wave transmitter) 401 may be used in combination as shown in FIG. 8B.

While the present invention is described above in terms of a configuration of arranging an insulating film 107 on a substrate 106. The present invention is by no means limited to such a configuration. A configuration where an insulating film 107 is arranged only in a limited region on a substrate 106 and a configuration where a substrate 106 is made to have the function of a second electrode 105 by using a low resistance substrate 106 are also applicable to the present invention. While a second electrode 105 is described above as a common electrode showing a common electric potential level, the present invention is by no means limited to such an arrangement and a first electrode 102 may alternatively be made to be a common electrode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-248680, filed Nov. 14, 2011, which is hereby incorporated by reference herein in its entirety.

REFERENCE SIGNS LIST

101: vibration film of cell
102: first electrode (upper electrode)
104: cell gap
105: second electrode (lower electrode)
106: substrate
108, 109: wiring line
110: vibration film of vibration film structure
112: gap of vibration film structure
200: cell
201: element
202: element separating interval
203: drive detecting unit

The invention claimed is:

1. An electromechanical transducer comprising a plurality of cells arranged on a substrate, each cell having a first electrode and a second electrode disposed opposite to the first electrode with a gap therebetween, and wherein
   a plurality of elements is provided, each including at least two cells with the first electrodes or second electrodes electrically connected to each other, and
   vibration film structures including respective vibration films disposed above the substrate with a gap therebetween are arranged in intervals which are devoid of elements separating the plurality of elements, such that radiation impedances of the plurality of elements are made to be equal to each other.

2. The electromechanical transducer according to claim 1, wherein wiring lines for electrically connecting the first electrodes or the second electrodes are also arranged in at least one of the vibration films of the vibration film structures and in the regions of the substrate located opposite to the vibration films of the vibration film structures.

3. The electromechanical transducer according to claim 1, wherein wiring lines for electrically connecting the first electrodes or the second electrodes are also arranged on the vibration films of the vibration film structures and in the regions of the substrate located opposite to the vibration films of the vibration film structures; and
   the electric potential of the wiring lines on the vibration films of the vibration film structures and the electric potential of the wiring lines of the regions of the substrate located opposite to the vibration films of the vibration film structure are held to a same potential level.

4. The electromechanical transducer according to claim 1, wherein the vibration films of the vibration film structures and the vibration films on which the first electrodes are formed have a same shape and arranged at a same periodicity.

5. The electromechanical transducer according to claim 1, wherein a sound insulation portion configured to insulate elastic waves or a sound absorption portion configured to absorb and attenuate elastic waves is arranged with a gap separating the portion and the substrate; and
   all the regions where the sound insulation portion or the sound absorption portion is not arranged are included in the region on the substrate where the plurality of elements are arranged as viewed in a direction perpendicular to the surfaces of the substrate.

6. A measuring instrument comprising:
   an electromechanical transducer according to claim 1 and configured at least one of to transmit elastic waves to an object of measurement and to receive elastic waves from an object of measurement; and
   an image information generator configured to generate image information on the object of measurement, using information of the signal transmitted from and information of the signal received by the electromechanical transducer.

* * * * *